United States Patent
Gilmore

(10) Patent No.: US 6,661,324 B1
(45) Date of Patent: Dec. 9, 2003

(54) VOLTAGE AND CURRENT SENSOR

(75) Inventor: Jack A. Gilmore, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/211,860

(22) Filed: Aug. 1, 2002

(51) Int. Cl.$^7$ .............................. H01F 38/20
(52) U.S. Cl. .................. 336/174; 336/200; 336/208; 336/223; 336/232; 336/173; 324/127
(58) Field of Search ................ 336/174, 200, 336/208, 223, 232, 229, 234, 65, 173; 324/127; 29/602.1

(56) References Cited

U.S. PATENT DOCUMENTS

| | | | |
|---|---|---|---|
| 3,146,417 A | 8/1964 | Pearson | |
| 5,430,613 A | * 7/1995 | Hastings et al. | 361/760 |
| 5,770,992 A | 6/1998 | Waters | |
| 6,563,296 B2 | * 5/2003 | Cooke | 324/127 |

* cited by examiner

Primary Examiner—Lincoln Donovan
Assistant Examiner—Jennifer A. Poker
(74) Attorney, Agent, or Firm—Benjamin Hudson, Jr.

(57) ABSTRACT

A voltage and current sensor comprised of a plurality of surface mounted inductors serially connected around the circumference of a current carrying conductor and a plurality of surface mounted resistors each connected in parallel with an inductor wherein an electrical circuit connected to the inductors and resistors provide a measurement of current in the conductor. The inductors and resistors are mounted on a printed circuit board that has a plated aperture for receiving the current carrying conductor there through. An electrical circuit connected to the plated aperture provides a voltage measurement.

4 Claims, 2 Drawing Sheets

VOLTAGE AND CURRENT SENSOR

BACKGROUND OF THE INVENTION

1. Field of the Invention

This invention relates generally, to current transformers utilized as voltage and current sensors, and more particularly to voltage and current sensors for making accurate measurements from an rf conductor in the presence of external electric and magnetic fields.

2. Brief Description of the Prior Art

It is well know by those skilled in the art that the typical toroidal transformer used to measure current in a conductor has a combined inductance and capacitance associated with the current transformer windings that can make the transformer ineffective at high frequencies. This is especially true when the transformers are used as voltage and current sensors in high frequency plasma processing applications. It is also well known that the orientation of a Faraday shielded torroidal current transformer is relatively impervious to the presence of external electrical and magnetic fields.

One attempt to overcome these problems was disclosed in the U.S. Pat. No. 3,146,417 issued to Pearson on Aug. 25, 1964. This patent teaches a transformer which includes a core having a plurality of windings wound around the core. A load resistor R is formed as a distributed resistor that has a plurality of taps connected to portions of the windings of the transformer. Each of the sections of winding and transformer included between two taps is now itself a small transformer whose contribution to the total output voltage is proportional to the fraction of the transformer determined by the number of turns and the proportion of resistance and capacitance between the taps. The Pearson patent teaches that the effect that the current transformer load resistance has upon the high frequency response and transient performance of the transformer depends upon the ratio of resistance to inductance of the load resistance. The higher the ratio, the better the high frequency and transient response.

Although, the Pearson patent demonstrated a device that had higher frequency response, it had several major drawbacks. The windings of the transformer had to be hand wound that was both labor intensive and costly. Also, the quality in the manufacture of the device could not be uniformly maintained from sensor to sensor.

U.S. Pat. No. 5,770,992 teaches a current sensor composed of traces embedded in a circuit board on one side of an RF conductor and a voltage sensor composed of a separate circuit board on the other side of an RF conductor. It is well know by those skilled in the art that a non-torroidal current transformer used to measure current in a conductor can make the transformer susceptible to external magnetic fields.

It would be desirable if there were provided a voltage and current sensor that could reliably make measurements that was easy to manufacture and was not susceptible to external magnetic and electric fields.

SUMMARY OF THE INVENTION

There is provided by this invention a voltage and current sensor that is not susceptible to external magnetic and electric fields. The sensor is generally comprised of a two-layer printed circuit board with multiple surface mounted inductors and resistors in parallel around the circumference of a conductor to sense the current and voltage of the conductor. A plated aperture used as a voltage sensor is recessed in the board to be completely shielded from the external influence of voltage fields.

BRIEF DESCRIPTION OF THE PREFERRED EMBODIMENTS

Figure 1:
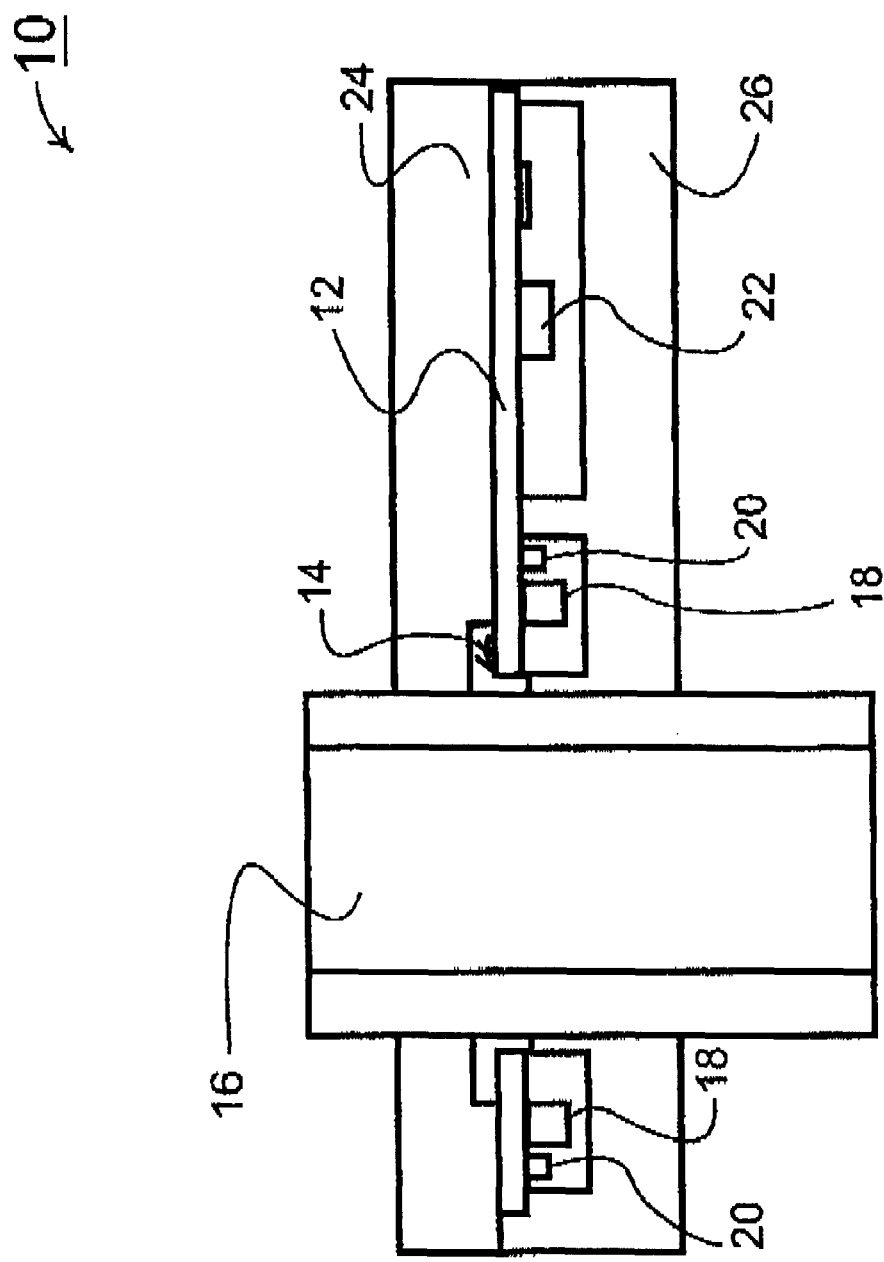
FIG. 1 is a block diagram of the voltage and current sensor incorporating the principles of this invention.

Referring to FIG. 1 there is shown a voltage and current sensor 10 that incorporates the principles of this invention. The voltage and current sensor 10 is generally comprised of a printed two-layer printed circuit board 12 that has a plated aperture or through hole 14. The printed circuit board may also include designs comprised of metalized ceramics or metallic traces imbedded in capton. A conductor 16 passes through the plated through hole 14. The plated through hole is recessed to be completely shielded from the external influence of electric fields. Mounted on the printed circuit board 12 are multiple inductors 18 that are spaced around the circumference of the conductor 16 to sense current. Each inductor 18 has a burden resistor 20 connected in parallel. External non-uniform magnetic fields are prevented from influencing the current measurement by the uniformly spaced surface mounted inductors around the conductor 16. Processing electronic elements 22 are also mounted on the board 12. An upper aluminum cover 24 and a lower aluminum cover 26 form a housing for the voltage and current sensor.

Figure 2:
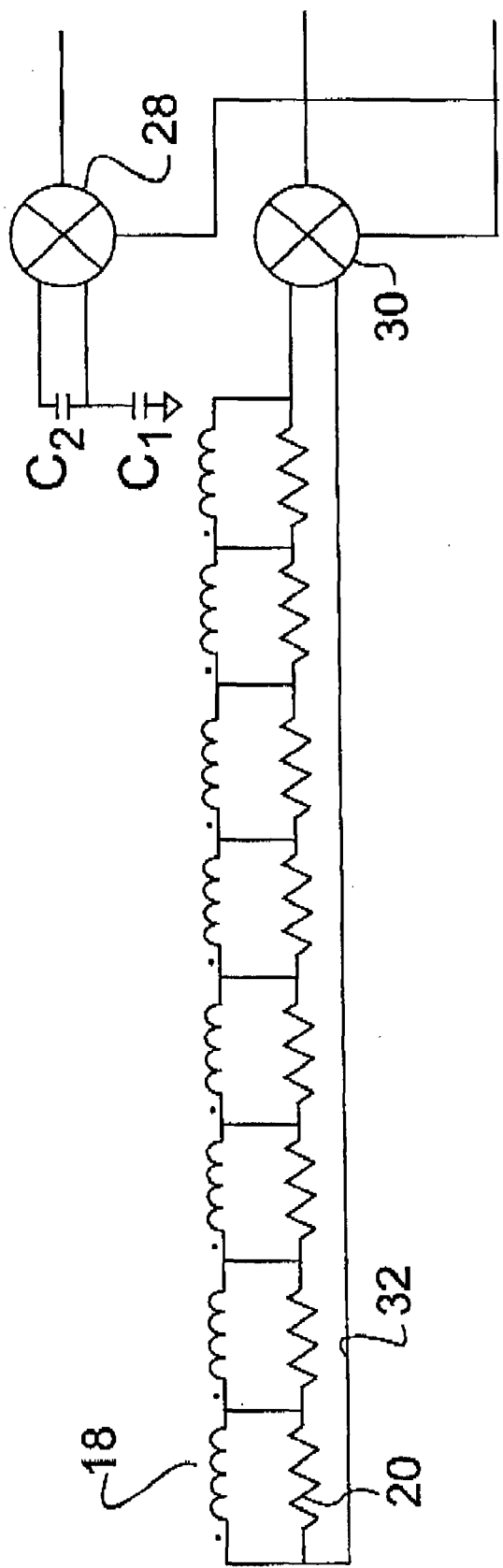
FIG. 2 is schematic of the voltage and current sensor incorporating the principles of this invention.

Referring to FIG. 2 there is shown schematically a representation of the voltage and current sensor 10. The plated through hole is connected to one side of a balanced mixer. The other side is capacitively connected to ground by means of capacitor $C_1$. Capacitor $C_2$ scales the response of the voltage sensor to a mixer 28 that provides the intermediate frequency voltage output to the user.

The inductors 18 each have a burden resistor 20 connected in parallel and are connected to a mixer 30 that provides the intermediate frequency current output. A one turn loop 32 cancels out the loop inherently created by the loop of inductors around the circumference of the conductor 16.

This surface mounted design of inductors and burden resistors has numerous advantages in the commercial market place. The circuit is less susceptible to non-homogeneous fields than the type of sensor disclosed in the U. S. Pat. No. 5,770,992. It requires no hand winding of toroids. It provides more uniformity from sensor to sensor. The machine placed parts are more accurately positioned than hand wound wires. It's provides for much easier addition of multiple burden resistors. It has a much lower assembly cost than traditional current transformers.

Although there is illustrated and described specific structure and details of operation, it is clearly understood that the same were merely for purposes of illustration and that changes and modifications may be readily made therein by those skilled in the art without departing from the spirit and the scope of this invention.

I claim:

1. A voltage and current sensor, comprising;
   - a printed circuit board having a plated aperture therein disposed to receive a current carrying conductor for measuring voltage and current;
   - a plurality of surface mounted inductors mounted serially connected around the circumference of the plated aperture;

a plurality of surface mounted resistors each connected in parallel with one of the surface mounted inductors;

an electrical circuit connected to the plated aperture for measuring the voltage potential of the current carrying conductor; and an electrical circuit connected to the plurality of parallel connected surface mounted inductors and resistors for measuring the current of the current carrying conductor.

2. A voltage and current sensor as recited in claim 1 wherein the electrical circuit connected to the plated aperture is comprised of a mixer for providing an intermediate frequency voltage output.

3. A voltage and current sensor recited in claim 2 wherein the electrical circuit connected to the plurality of parallel-connected surface mounted inductors and resistors is comprised of a mixer for providing an intermediate frequency current output.

4. A voltage and current sensor as recited in claim 1 wherein the current carrying conductor is a coaxial rf conductor.

* * * * *